United States Patent
Choi et al.

(10) Patent No.: US 11,309,383 B1
(45) Date of Patent: Apr. 19, 2022

(54) QUAD-LAYER HIGH-K FOR METAL-INSULATOR-METAL CAPACITORS

(71) Applicant: International Business Machines Corporation, Armonk, NY (US)

(72) Inventors: Kisik Choi, Watervliet, NY (US); Takashi Ando, Eastchester, NY (US); Paul Charles Jamison, Hopewell Junction, NY (US); John Greg Massey, Chittenden, VT (US); Eduard Albert Cartier, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/122,004

(22) Filed: Dec. 15, 2020

(51) Int. Cl.
*H01L 49/02* (2006.01)
*H01L 21/02* (2006.01)

(52) U.S. Cl.
CPC ............ *H01L 28/91* (2013.01); *H01L 21/022* (2013.01); *H01L 21/02178* (2013.01); *H01L 21/02181* (2013.01); *H01L 28/40* (2013.01); *H01L 28/60* (2013.01)

(58) Field of Classification Search
CPC ......... H01L 28/91; H01L 28/40; H01L 28/60; H01L 21/022; H01L 21/02178; H01L 21/02181

See application file for complete search history.

(56) References Cited

U.S. PATENT DOCUMENTS

| | | | |
|---|---|---|---|
| 7,944,732 B2 | 5/2011 | De Jong | |
| 8,962,423 B2 | 2/2015 | Cheng | |
| 9,418,999 B2 | 8/2016 | Wu | |
| 9,876,068 B1 | 1/2018 | Yang | |
| 10,229,873 B2 | 3/2019 | Kim | |
| 2004/0043557 A1* | 3/2004 | Haukka | H01L 21/02192 438/240 |
| 2005/0110115 A1* | 5/2005 | Kil | H01L 21/3141 257/532 |
| 2007/0102742 A1* | 5/2007 | Kil | H01L 28/40 257/295 |
| 2010/0091428 A1* | 4/2010 | Kim | H01L 21/768 361/313 |
| 2018/0006108 A1 | 1/2018 | Ando | |

(Continued)

OTHER PUBLICATIONS

Ando, et al., "CMOS Compatible MIM Decoupling Capacitor with Reliable Sub-nm EOT High-k Stacks for the 7 nm Node and Beyond", 2016 IEEE International Electron Devices Meeting (IEDM), pp. 236-239.

(Continued)

*Primary Examiner* — Jose R Diaz
(74) *Attorney, Agent, or Firm* — Michael A. Petrocelli

(57) ABSTRACT

A semiconductor structure, and a method of making the same includes a multiple electrode stacked capacitor containing a sequence of first metal layers interleaved with second metal layers. A quad-layer stack separates each of the first metal layers from each of the second metal layers, the quad-layer dielectric stack includes a first dielectric layer made of $Al_2O_3$, a second dielectric layer made of $HfO_2$, a third dielectric layer made of $Al_2O_3$, and a fourth dielectric layer made of $HfO_2$.

25 Claims, 2 Drawing Sheets

(56) References Cited

U.S. PATENT DOCUMENTS

2020/0312552 A1    10/2020    Kim

OTHER PUBLICATIONS

Fischer, et al., "Low-k interconnect stack with multi-layer air gap and tri-metal-insulator-metal capacitors for 14nm high volume manufacturing", 2015 IEEE International Interconnect Technology Conference and 2015 IEEE Materials for Advanced Metallization Conference (IITC/MAM), pp. 5-8.

Lin, et al., "Reliability Characteristics of a High Density Metal-Insulator-Metal Capacitor on Intel's 10+ Process", 2020 IEEE International Reliability Physics Symposium (IRPS), 4 pages.

Park, et al., "Dielectric Stacking Effect of Al2O3 and HfO2 in Metal-Insulator-Metal Capacitor", IEEE Electron Device Letters, vol. 34, No. 1, Jan. 2013, pp. 120-122, <https://www.researchgate.net/publication/258789031_Dielectric_Stacking_Effect_of_Al_2_O_3_and_HfO_2_in_Metal-Insulator_Metal_Capacitor>.

Salomone, et al., "Electron Trapping in Al2O3/HfO2 Nanolaminate-based MOS Capacitors", 2012 Argentine School of Micro-nanoelectronics, Technology and Applications, IEEE Catalog No. CFP1254E-CDR, Jan. 2012, pp. 90-95, <https://www.researchgate.net/publication/261482480_Electron_trapping_in_Al2O3HfO2_nanolaminate-based_MOS_capacitors>.

Zulkifeli, et al., "The Effect of Different Dielectric Materials in Designing High-Performance Metal-Insulator-Metal (MIM) Capacitors", International Journal of Electrical and Computer Engineering (IJECE), vol. 7, No. 3, Jun. 2017, pp. 1554-1561, <https://www.researchgate.net/publication/318272213_The_Effect_of_Different_Dielectric_Materials_in_Designing_High-Performance_Metal-Insulator-Metal_MIM_Cagacitors>.

International Search Report and Written Opinion, International Application No. PCT/EP2021/081297, dated Feb. 8, 2022, 12 pages.

Choi, et al., "Quad-Layer High-K for Metal-Insulator-Metal Capacitors", International Application No. PCT/EP2021/081297, International Filing Date Nov. 10, 2021, 15 ages.

* cited by examiner

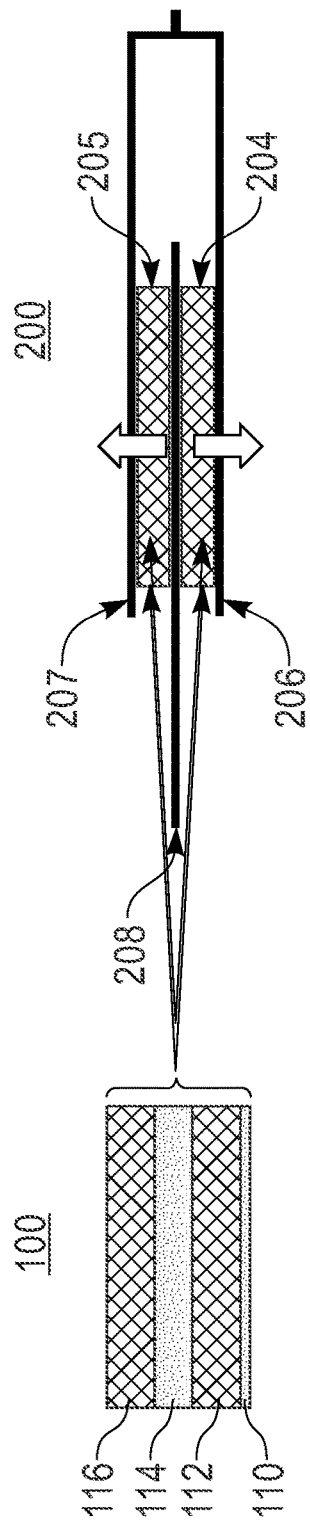
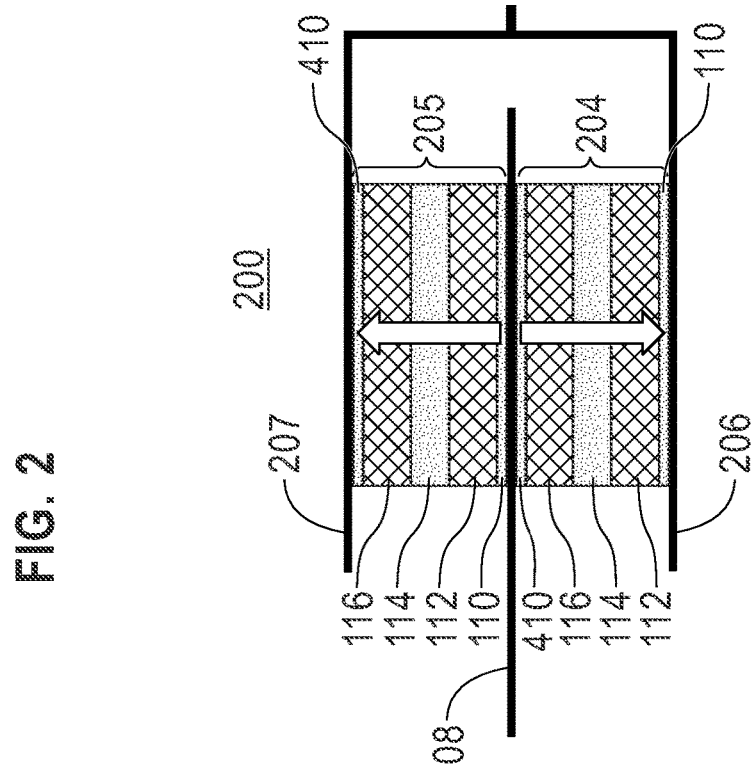
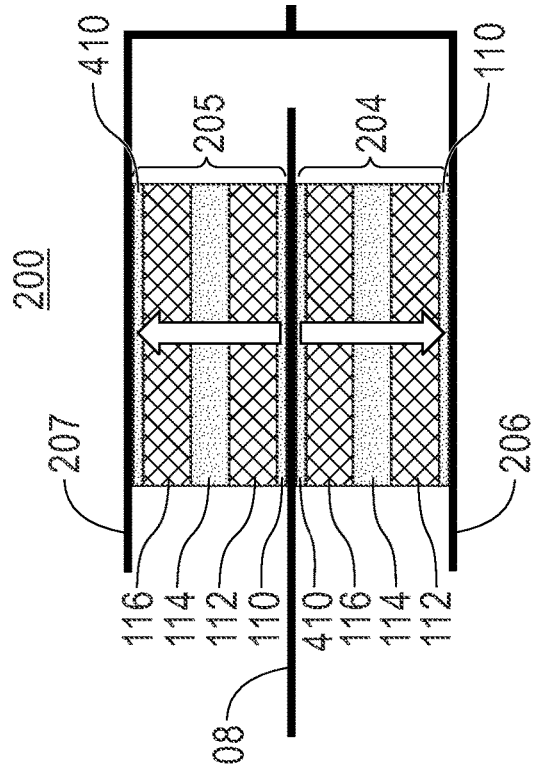
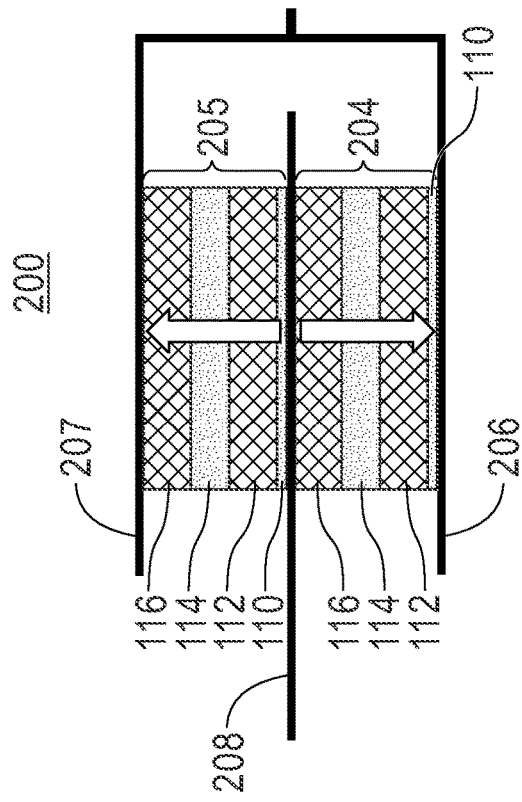

QUAD-LAYER HIGH-K FOR METAL-INSULATOR-METAL CAPACITORS

BACKGROUND

The present invention generally relates to the field of semiconductor devices, and more particularly to fabrication of stacked capacitors having symmetric leakage and breakdown behaviors.

High capacity capacitors have been used in the semiconductor industry for years, in applications such as dynamic random-access memory (DRAM) storage, protection from high energy environments, decoupling capacitors and many more. As integrated circuits continue to become more densely built, small and powerful decoupling capacitors are needed for optimal system performance.

SUMMARY

Shortcomings of the prior art are overcome and additional advantages are provided through the provision of a method for forming a semiconductor structure that includes forming a multiple electrode stacked capacitor including a sequence of first metal layers interleaved with second metal layers. A quad-layer stack separates each of the first metal layers from each of the second metal layers. The quad-layer dielectric stack includes a first dielectric layer made of aluminum oxide ($Al_2O_3$), a second dielectric layer made of hafnium oxide ($HfO_2$), a third dielectric layer made of $Al_2O_3$, and a fourth dielectric layer made of $HfO_2$.

Another embodiment of the present disclosure provides a method of forming a semiconductor structure that includes forming a first metal layer, forming a first quad-layer dielectric stack on a surface of the first metal layer, forming a second metal layer on a surface of the first quad-layer dielectric stack, forming a second quad-layer dielectric stack disposed on a surface of the second metal layer, and forming a third metal layer disposed on a surface of the second quad-layer dielectric stack. Each of the first quad-layer dielectric stack and the second quad-layer dielectric stack includes a first dielectric layer comprising $Al_2O_3$, a second dielectric layer comprising $HfO_2$, a third dielectric layer comprising $Al_2O_3$, and a fourth dielectric layer comprising $HfO_2$.

Another embodiment of the present disclosure provides a semiconductor structure that includes a first metal layer, a first quad-layer dielectric stack disposed on a surface of the first metal layer, a second metal layer disposed on a surface of the first quad-layer dielectric stack, a second quad-layer dielectric stack disposed on a surface of the second metal layer, and a third metal layer disposed on a surface of the second quad-layer dielectric stack. Each of the first quad-layer dielectric stack and the second quad-layer dielectric stack includes a first dielectric layer comprising $Al_2O_3$, a second dielectric layer comprising $HfO_2$, a third dielectric layer comprising $Al_2O_3$, and a fourth dielectric layer comprising $HfO_2$.

BRIEF DESCRIPTION OF THE DRAWINGS

The following detailed description, given by way of example and not intended to limit the invention solely thereto, will best be appreciated in conjunction with the accompanying drawings, in which:

FIG. 1 is a cross-sectional view of a quad-layer high-k dielectric stack, according to an embodiment of the present disclosure;

FIG. 2 is a cross-sectional view of a stacked planar capacitor in which the quad-layer high-k dielectric stack is implemented, according to an embodiment of the present disclosure;

FIG. 3 is a detailed view of the stacked planar capacitor of FIG. 2, according to an embodiment of the present disclosure;

FIG. 4 is a detailed view of the stacked planar capacitor of FIG. 2 illustrating an alternate configuration of a high-k dielectric stack, according to another embodiment of the present disclosure.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 5:
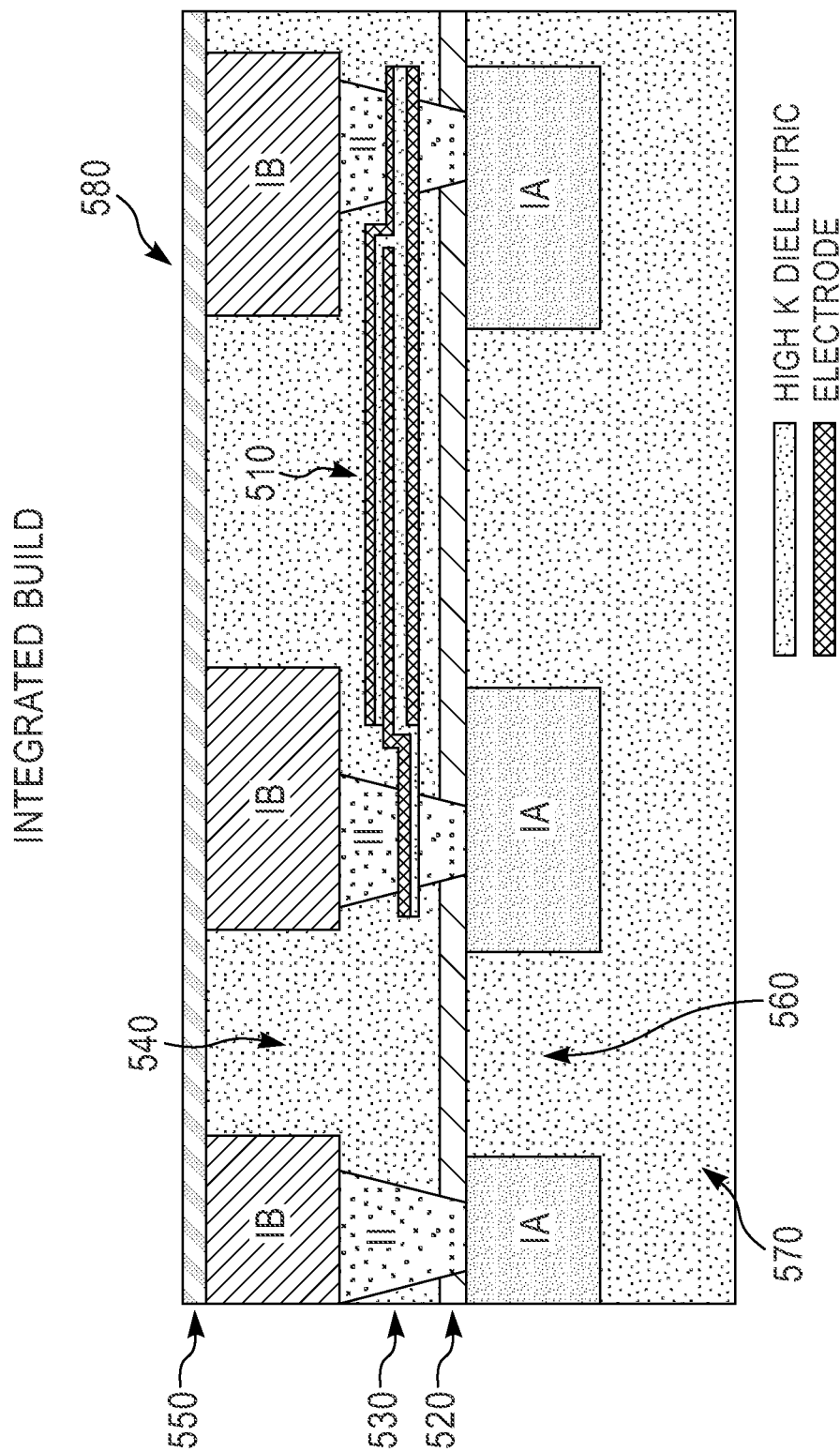
FIG. 5 is a cross-sectional view of an integrated build of the stacked planar capacitor, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As previously noted, high capacity capacitors have been used in the semiconductor industry for years, in applications such as dynamic random-access memory (DRAM) storage, protection from high energy environments, decoupling capacitors and many more. As integrated circuits continue to become more densely built, small and powerful decoupling capacitors are needed for optimal system performance.

Techniques employed to obtain sufficiently high capacitance density per area include providing a three-dimensional (3-D) capacitor structure, three-electrode stacked capacitor structures (for decoupling capacitors), and increased k values for the capacitor's high-k insulator. However, because the electrical bias polarities are opposite for the bottom capacitor and the top capacitor in three-electrode stacked capacitor designs, the high-k thickness needs to be high to pass reliability specs for the weaker side. This results in lower capacitance density.

Therefore, embodiments of the present disclosure provide a method and associated structure for fabricating a stacked capacitor having symmetric leakage and break-down behaviors. More specifically, embodiments of the present disclosure provide a quadruple-layer stack (hereinafter "quad-layer stack") as the dielectric insulator for multiple electrode (>2) stacked capacitor. An embodiment by which a multiple electrode (>2) stacked capacitor having symmetric leakage and break-down behaviors can be formed is described in detailed below by referring to the accompanying drawings in FIGS. 1-3.

Referring now to FIG. 1, a cross-sectional view of a quad-layer stack 100 is shown, according to an embodiment of the present disclosure. The quad-layer stack 100 includes four layers of dielectric materials namely first dielectric layer 110, second dielectric layer 112, third dielectric layer 114, and fourth dielectric layer 116.

The layers of the quad-layer stack 100 are chosen such that the dielectric break-down behavior is symmetric for the biasing polarity of a bottom electrode and the biasing polarity of a top electrode in, for example, a three-electrode stacked capacitor design, thus enabling high-k thickness scaling.

According to an embodiment, the first dielectric layer 110 includes a sub-monolayer of aluminum oxide ($Al_2O_3$), each of the second dielectric layer 112 and the fourth dielectric layer 116 includes a layer of hafnium oxide ($HfO_2$), and the third dielectric layer 114 includes a layer of aluminum oxide ($Al_2O_3$).

As shown in FIG. 1, the second dielectric layer 112 including $HfO_2$ is disposed over a surface of the first dielectric layer 110 including $Al_2O_3$, the third dielectric layer 114 including $Al_2O_3$ is disposed over a surface of the second dielectric layer 112 including $HfO_2$, and the fourth dielectric layer 116 including $HfO_2$ is disposed over a surface of the third dielectric layer 114 including $Al_2O_3$. In some embodiments, the quad-layer stack 100 formed by the first dielectric layer 110, second dielectric layer 112, third dielectric layer 114, and fourth dielectric layer 116 includes a high-k dielectric having dielectric constant greater than about 2.5.

The quad-layer stack 100 ($Al_2O_3/HfO_2/Al_2O_3/HfO_2$) can have a thickness varying from about 5 Å to about 100 Å, in some embodiments, from about 10 Å to about 80 Å, and in some other embodiments, from about 15 Å to about 50 Å. Preferably, a thickness of the first dielectric layer 110 including $Al_2O_3$ is less than about 4 Å. In an embodiment, a thickness of the first dielectric layer 110 can vary from about 1 Å to about 3 Å, and ranges there between. In another embodiment a thickness of the first dielectric layer 110 can be equal to 2 Å.

The substantially thin first dielectric layer 110 including $Al_2O_3$ can act as a passivation layer between a metal electrode underneath the first dielectric layer 110 and the above $HfO_2/Al_2O_3/HfO_2$ stack formed by the second dielectric layer 112, third dielectric layer 114, and fourth dielectric layer 116. As will be explained in detail below, by forming the substantially thin first dielectric layer 110 as the first layer below the traditional $HfO_2/Al_2O_3/HfO_2$ stack significant improvement in Time Dependent Dielectric Breakdown (TDDB) characteristics have been observed for bottom electron injection bias due to the passivation of the interface between metal electrode(s) and the $HfO_2/Al_2O_3/HfO_2$ stack.

With continued reference to FIG. 1, each of the second dielectric layer 112 and the fourth dielectric layer 116 including $HfO_2$ can have a thickness that is substantially the same and can vary from about 20 Å to about 50 Å, and ranges there between. The third dielectric layer 114 of the quad-layer stack 100 including $Al_2O_3$ can have a thickness varying from about 5 Å to about 30 Å and ranges there between.

Known deposition techniques can be implemented to form the first, second, third and fourth dielectric layers of the quad-layer stack 100 including, for example, atomic layer deposition (ALD). In an embodiment, the first dielectric layer 110 including $Al_2O_3$ is preferably deposited in less than 5 ALD cycles to achieve a preferred thickness of about less than 4 Å.

As known by those skilled in the art, in some embodiments, the quad-layer stack 100 can be included in a layered structure between two or more metal layers (i.e., electrodes). In such embodiments, the-two or more metal layers are insulated from each other by the quad-layer stack 100. An adjacent pair of the two or more metal layers can include a first-type metal layer and a second-type metal layer, which can be the same or different. Reference throughout the following description to 'metal' refers to any conductive material.

A sequence of quad-layer stack, first metal layer, quad-layer stack, and second metal layer can be repeated n times. For example, repeating n=four times would produce a structure with n+1=5 first metal layers interleaved with 5 second metal layers, with a quad-layer stack $Al_2O_3/HfO_2/Al_2O_3/HfO_2$ separating adjacent metal layers. The stack can be completed, after repeating the first four metal layers as desired (or not repeating even once), by depositing a final dielectric layer. Such a final stack would have an equal number of the first and second metal layers. Alternatively, after forming just the first four metal layers, or after repeating the four-layer sequence 'n' times, the stack can be completed by depositing another quad-layer stack $Al_2O_3/HfO_2/Al_2O_3/HfO_2$, then a final first metal layer. The stack in such an embodiment would have n+1 second metal layers and n+2 first metal layers.

In some other embodiments, the layered structure can further include a first electrode contacting each second-type metal layer and insulated from each first-type metal layer, a second electrode contacting each first-type metal layer and insulated from each second-type metal layer, and a dielectric material separating and insulating the first electrode from each first-type metal layer and separating and insulating the second electrode from each second-type metal layer.

In still some other embodiments, the two or more metal layers can include a stack of metal layers including three metal layers, as shown in FIG. 2 below.

Referring now to FIG. 2, a cross-sectional view of a stacked planar capacitor 200 is shown, according to an embodiment of the present disclosure. In this embodiment, the stacked planar capacitor 200 is a metal-insulator-metal (MIM) capacitor including a first metal layer 206, a first quad-layer dielectric stack 204 disposed over a surface of the first metal layer 206, a second metal layer 208 disposed over a surface of the first quad-layer dielectric stack 204, a second quad-layer dielectric stack 205 disposed over a surface of the second metal layer 208, and a third metal layer 207 disposed over a surface of the second quad-layer dielectric stack 205. For illustration purposes only, without intent of limitation, the present embodiment is described in a three-electrode (i.e., "stacked") capacitor. It should be noted that the present embodiment can be applied to any stacked capacitor including two or more metal electrodes.

Each of the first quad-layer dielectric stack 204 and the second quad-layer dielectric stack 205 consist of a quadruple ($Al_2O_3/HfO_2/Al_2O_3/HfO_2$) layer dielectric stack equal to the quad-layer stack 100 of FIG. 1. According to an embodiment, the first dielectric layer 110 in the first quad-layer dielectric stack 204 is located directly above the first metal layer 206 and the first dielectric layer 110 in the second quad-layer dielectric stack 205 is located directly above the second metal layer 208 of the stacked planar capacitor 200. As described above, the (thin) first dielectric layer including $Al_2O_3$ can act as a passivating oxide layer in the stacked planar capacitor 200.

A thickness of the first metal layer 206, the second metal layer 208 and the third metal layer 207 is determined by a structural integrity of the metal and the conductivity requirement as well as the number of layers desired. In an exemplary embodiment, each of the first metal layer 206, the second metal layer 208 and the third metal layer 207 can be fabricated from a first-type conductive material such as titanium nitride (TiN). Although, the first metal layer 206, the second metal layer 208 and the third metal layer 207 can include the same or different conductive materials.

A typical thickness of each of the first metal layer 206, the second metal layer 208 and the third metal layer 207 can vary from about 200 Å to about 500 Å, with about 300 Å to about 400 Å being a desirable thickness. The first metal layer 206, the second metal layer 208 and the third metal layer 207 can be deposited with typical thin film deposition techniques, such as physical vapor deposition or atomic layer deposition.

Referring now to FIG. 3, a detailed view of the stacked planar capacitor 200 of FIG. 2 is shown, according to an embodiment of the present disclosure. As can be appreciated in the figure, the first dielectric layer 110 is positioned at an interface between the first metal layer 206 and the above $HfO_2/Al_2O_3/HfO_2$ stack formed by the second dielectric layer 112, third dielectric layer 114, and fourth dielectric layer 116. Similarly, in this embodiment, the first dielectric layer 110 is located at an interface between the second metal layer 208 and the above $HfO_2/Al_2O_3/HfO_2$ stack formed by the second dielectric layer 112, third dielectric layer 114, and fourth dielectric layer 116.

By doing this, the first dielectric layer 110 in the first quad-layer dielectric stack 204 and the first dielectric layer 110 in the second quad-layer dielectric stack 205 passivates an interface between each of the first and second metal layers 206, 208 and the above $HfO_2/Al_2O_3/HfO_2$ stack. This may in turn improve break-down behavior for bottom electron injection bias. Experimental results have shown that the improved symmetry resulted in improvement of TDDB (Weibull slope) for bottom injection bias (weak side).

Referring now to FIG. 4, a detailed view of the stacked planar capacitor of FIG. 2 illustrating an alternate configuration of a high-k dielectric stack is shown, according to an alternate embodiment of the present disclosure.

In this embodiment, an additional fifth dielectric layer 410 including $Al_2O_3$ may be formed above the fourth dielectric layer 116 including $HfO_2$. In such embodiments, the fifth dielectric layer 410 has a thickness and is made of similar materials as the (thin) first dielectric layer 110, described above with reference to FIG. 1. The (thin) fifth dielectric layer 410 may have a similar passivating effect as the first dielectric layer 110 but for the top electrode. Specifically, the fifth dielectric layer 410 passivates an interface between each of the second metal layer 208 and the third metal layer 207 of the stacked planar capacitor 200 and the $HfO_2/Al_2O_3/HfO_2/Al_2O_3$ stack below formed by the fourth dielectric layer 116, the third dielectric layer 114, the second dielectric layer 112, and the first dielectric layer 110.

Thus, by forming the first dielectric layer 110 including $Al_2O_3$ as a sub-monolayer located at an interface between a metal electrode and the conventional $HfO_2/Al_2O_3/HfO_2$ dielectric stack, TDDB characteristics can be improved for bottom electron injection bias by passivating the interface between the metal electrode and the $HfO_2/Al_2O_3/HfO_2$ stack.

Embodiments of the present disclosure provide a quad-layer high-k dielectric consisting of four distinctive layers of $Al_2O_3/HfO_2/Al_2O_3/HfO_2$ that can make the dielectric breakdown behavior in MIM capacitors symmetric for both biasing polarities, thus enabling high-k thickness scaling. This allows application to multiple electrode (>2) structures with opposing biasing polarities for each dielectric layer.

The substantially thin first dielectric layer 110 of the quad-layer dielectric stack 100 (FIG. 1) can prevent undesired reactions with bottom electrode(s), and minimizes TDDB asymmetry. Thus, the first dielectric layer 110 makes the proposed $Al_2O_3/HfO_2/Al_2O_3/HfO_2$ stack applicable to stacked MIM structures. This may enable further capacitance enhancements in multi-plate (>2) MIM capacitors with aggressively scaled equivalent oxide thickness (EOT), for advanced CMOS technology nodes.

Referring now to FIG. 5, an integrated build 580 including a quad-layer high-k dielectric stack 510 manufactured according to embodiments of the present disclosure is shown. Specifically, in this embodiment, the integrated build 580 includes a quad-layer high-k dielectric stack 510 consisting of four distinctive layers of $Al_2O_3/HfO_2/Al_2O_3/HfO_2$ fabricated according to the aforementioned embodiments.

As mentioned above, the proposed quad-layer high-k dielectric stack 510 can make the dielectric break-down behavior in MIM capacitors symmetric for both biasing polarities, thus enabling high-k thickness scaling triple layer dielectric. It should be noted that FIG. 5 is an illustration of an implementation of the proposed quad-layer high-k dielectric stack, other configurations can be considered based on device design and yield requirements.

As illustrated in the figure, the quad-layer high-k dielectric stack 510 is disposed between a first metallization layer IA and a second metallization layer IB connected via a contact II. In some embodiments, at least one of a first interlevel dielectric, 520 a second interlevel dielectric 530, a third interlevel dielectric 540, a fourth interlevel dielectric 550, a fifth interlevel dielectric 560, and a sixth interlevel dielectric 570 can be coated.

Although the invention has been shown and described with respect to a certain embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the described structure which performs the function in the herein illustrated exemplary embodiments of the invention. In addition, while a particular feature of the invention may have been described with respect to only one of several embodiments, such feature may be combined with one or more features of the other embodiments as may be desired and advantageous for any given or particular application.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, the method comprising:
    forming a multiple electrode stacked capacitor including a sequence of first metal layers interleaved with second metal layers, and separating each of the first metal layers from each of the second metal layers with a quad-layer stack; and
    forming the quad-layer dielectric stack using:
        a first dielectric layer comprising $Al_2O_3$,
        a second dielectric layer comprising $HfO_2$,
        a third dielectric layer comprising $Al_2O_3$, and
        a fourth dielectric layer comprising $HfO_2$.

2. The method of claim 1, wherein the sequence of first metal layers interleaved with the second metal layers comprises two or more of the first metal layers and two or more of the second metal layers.

3. The method of claim 1, wherein the second dielectric layer comprising $HfO_2$ is directly above the first dielectric layer comprising $Al_2O_3$, the third dielectric layer comprising $Al_2O_3$ is directly above the second dielectric layer comprising $HfO_2$, and the fourth dielectric layer comprising $HfO_2$ is directly above the third dielectric layer comprising $Al_2O_3$.

4. The method of claim 1, wherein the first dielectric layer of the quad-layer dielectric stack passivates an interface between each of the first metal layers and the above $HfO_2/Al_2O_3/HfO_2$ stack formed by the second dielectric layer, the third dielectric layer, and the fourth dielectric layer.

5. The method of claim 1, further comprising:
    forming a fifth dielectric layer comprising $Al_2O_3$ above the fourth dielectric layer comprising $HfO_2$, wherein a thickness of the fifth dielectric layer is equal to a thickness of the first dielectric layer, the fifth dielectric layer passivates an interface between each of the second metal layers and the $HfO_2/Al_2O_3/HfO_2/Al_2O_3$ stack below formed by the forth dielectric layer, the third dielectric layer, the second dielectric layer, and the first dielectric layer.

6. A method of forming a semiconductor structure, the method comprising:
    forming a first metal layer;
    forming a first quad-layer dielectric stack on a surface of the first metal layer;
    forming a second metal layer on a surface of the first quad-layer dielectric stack;
    forming a second quad-layer dielectric stack disposed on a surface of the second metal layer; and
    forming a third metal layer disposed on a surface of the second quad-layer dielectric stack, wherein each of the first quad-layer dielectric stack and the second quad-layer dielectric stack comprises:
        a first dielectric layer comprising $Al_2O_3$,
        a second dielectric layer comprising $HfO_2$,
        a third dielectric layer comprising $Al_2O_3$, and
        a fourth dielectric layer comprising $HfO_2$.

7. The method of claim 1, wherein the first metal layer, the first quad-layer dielectric stack, and the second metal layer define a first capacitor comprising a first electrical bias polarity.

8. The method of claim 7, wherein the second metal layer, the second quad-layer dielectric stack, and the third metal layer define a second capacitor comprising a second electrical bias polarity, the second electrical bias polarity being opposite to the first electrical bias polarity.

9. The method of claim 8, wherein a dielectric breakdown behavior is symmetric for both of the first electrical bias polarity and the second electrical bias polarity.

10. The method of claim 1, wherein the second dielectric layer comprising $HfO_2$ is directly above the first dielectric layer comprising $Al_2O_3$, the third dielectric layer comprising $Al_2O_3$ is directly above the second dielectric layer comprising $HfO_2$, and the fourth dielectric layer comprising $HfO_2$ is directly above the third dielectric layer comprising $Al_2O_3$.

11. The method of claim 6, wherein the first dielectric layer of the first quad-layer dielectric stack is formed directly above the first metal layer to passivate a first interface between the first metal layer and the above $HfO_2/Al_2O_3/HfO_2$ stack formed by the second dielectric layer, the third dielectric layer, and the fourth dielectric layer of the first quad-layer dielectric stack.

12. The method of claim 6, wherein the first dielectric layer of the second quad-layer dielectric stack is formed directly above the second metal layer to passivate a second interface between the second metal layer and the above $HfO_2/Al_2O_3/HfO_2$ stack formed by the second dielectric layer, the third dielectric layer, and the fourth dielectric layer of the second quad-layer dielectric stack.

13. The method of claim 6, wherein a thickness of the first dielectric layer is less than 4 Å.

14. The method of claim 6, further comprising:
forming a sequence of metal layers, wherein each pair of metal layers in the sequence of metal layers is separated by a quad-layer dielectric stack comprising the first dielectric layer, the second dielectric layer, the third dielectric layer, and the fourth dielectric layer.

15. The method of claim 6, further comprising:
forming a fifth dielectric layer comprising $Al_2O_3$ above the fourth dielectric layer comprising $HfO_2$, wherein a thickness of the fifth dielectric layer is equal to the thickness of the first dielectric layer, the fifth dielectric layer passivates an interface between each of the second metal layer and the third metal layer and the $HfO_2/Al_2O_3/HfO_2/Al_2O_3$ stack below formed by the forth dielectric layer, the third dielectric layer, the second dielectric layer, and the first dielectric layer.

16. A semiconductor structure comprising:
a first metal layer;
a first quad-layer dielectric stack disposed on a surface of the first metal layer;
a second metal layer disposed on a surface of the first quad-layer dielectric stack;
a second quad-layer dielectric stack disposed on a surface of the second metal layer; and
a third metal layer disposed on a surface of the second quad-layer dielectric stack, wherein each of the first quad-layer dielectric stack and the second quad-layer dielectric stack comprises:
a first dielectric layer comprising $Al_2O_3$,
a second dielectric layer comprising $HfO_2$,
a third dielectric layer comprising $Al_2O_3$, and
a fourth dielectric layer comprising $HfO_2$.

17. The semiconductor structure of claim 16, wherein the first metal layer, the first quad-layer dielectric stack, and the second metal layer define a first capacitor comprising a first electrical bias polarity.

18. The semiconductor structure of claim 17, wherein the second metal layer, the second quad-layer dielectric stack, and the third metal layer define a second capacitor comprising a second electrical bias polarity, the second electrical bias polarity opposite the first electrical bias polarity.

19. The semiconductor structure of claim 18, wherein a dielectric break-down behavior is symmetric for both of the first electrical bias polarity and the second electrical bias polarity.

20. The semiconductor structure of claim 16, wherein the second dielectric layer comprising $HfO_2$ is directly above the first dielectric layer comprising $Al_2O_3$, the third dielectric layer comprising $Al_2O_3$ is directly above the second dielectric layer comprising $HfO_2$, and the fourth dielectric layer comprising $HfO_2$ is directly above the third dielectric layer comprising $Al_2O_3$.

21. The semiconductor structure of claim 16, wherein the first dielectric layer of the first quad-layer dielectric stack is positioned directly above the first metal layer to passivate a first interface between the first metal layer and the above $HfO_2/Al_2O_3/HfO_2$ stack formed by the second dielectric layer, the third dielectric layer, and the fourth dielectric layer of the first quad-layer dielectric stack.

22. The semiconductor structure of claim 16, wherein the first dielectric layer of the second quad-layer dielectric stack is positioned directly above the first metal layer to passivate a second interface between the second metal layer and the above $HfO_2/Al_2O_3/HfO_2$ stack formed by the second dielectric layer, the third dielectric layer, and the fourth dielectric layer of the second quad-layer dielectric stack.

23. The semiconductor structure of claim 16, wherein a thickness of the first dielectric layer is less than 4 Å.

24. The semiconductor structure of claim 16, further comprising:
a sequence of metal layers, wherein each pair of metal layers in the sequence of metal layers is separated by a quad-layer dielectric stack comprising the first dielectric layer, the second dielectric layer, the third dielectric layer, and the fourth dielectric layer.

25. The semiconductor structure of claim 16, further comprising:
a fifth dielectric layer comprising $Al_2O_3$ directly above the fourth dielectric layer comprising $HfO_2$, wherein a thickness of the fifth dielectric layer is equal to the thickness of the first dielectric layer, the fifth dielectric layer passivates an interface between each of the second metal layer and the third metal layer and the $HfO_2/Al_2O_3/HfO_2/Al_2O_3$ stack below formed by the fourth dielectric layer, the third dielectric layer, the second dielectric layer, and the first dielectric layer.

* * * * *